(12) United States Patent
Leonardi et al.

(10) Patent No.: US 6,441,445 B1
(45) Date of Patent: Aug. 27, 2002

(54) INTEGRATED DEVICE WITH BIPOLAR TRANSISTOR AND ELECTRONIC SWITCH IN "EMITTER SWITCHING" CONFIGURATION

(75) Inventors: Salvatore Leonardi; Davide Patti; Delfo Sanfilippo, all of Catania (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/413,740

(22) Filed: Oct. 6, 1999

(51) Int. Cl.[7] .................. H01L 29/76; H01L 29/94; H01L 31/062
(52) U.S. Cl. .................. 257/378; 257/337; 257/341
(58) Field of Search .................. 257/327, 337, 257/341, 342, 378, 140, 146, 212

(56) References Cited

U.S. PATENT DOCUMENTS

| | | | | |
|---|---|---|---|---|
| 5,118,635 A | * | 6/1992 | Frisina et al. | 257/378 |
| 5,866,461 A | * | 2/1999 | Puzzolo et al. | 438/323 |

FOREIGN PATENT DOCUMENTS

| | | | | |
|---|---|---|---|---|
| EP | 0646965 A1 | * | 4/1995 | 257/378 |

* cited by examiner

Primary Examiner—Steven Loke
(74) Attorney, Agent, or Firm—Lisa K. Jorgenson; Allen, Dyer, Doppelt, Milbrath & Gilchrist, P.A.

(57) ABSTRACT

The integrated circuit device has a vertical conduction structure in which a region, which contains the base of a bipolar transistor, has zones having different concentrations. The concentrations are lower where the flow of charges is more intense and higher elsewhere. A high gain of the bipolar transistor and a low resistance of the electronic switch in conduction are thus obtained.

19 Claims, 3 Drawing Sheets

INTEGRATED DEVICE WITH BIPOLAR TRANSISTOR AND ELECTRONIC SWITCH IN "EMITTER SWITCHING" CONFIGURATION

FIELD OF THE INVENTION

The present invention relates to monolithic, semiconductor integrated structures and, more particularly, to an integrated circuit device including a bipolar transistor and an electronic switch which are connected to one another in the "emitter switching" configuration.

BACKGROUND OF THE INVENTION

As is known, an "emitter switching" configuration includes a vertical bipolar transistor, generally a power transistor for high voltage operation, and an electronic switch in series with the emitter of the bipolar transistor. The electronic switch may be a field effect transistor or a bipolar transistor for low voltage operation connected, by its drain or collector terminal, respectively, to the emitter terminal of the bipolar transistor. The opening of the electronic switch allows an extremely rapid switching off of the high voltage bipolar transistor, so that such a configuration is advantageously used in applications in which the high voltage bipolar transistor is caused to function in rapid switching between its conducting state and its non-conducting state.

A known integrated structure of a device including a vertical bipolar power transistor and a vertical MOS field effect (VDMOS) transistor in the above described configuration is illustrated in FIG. 1. It is formed on a substrate 10 of semiconductor material, for example of N+ monocrystalline silicon, i.e. with a high concentration of N type doping impurities. (It should be noted that in the following description and in the drawings, the concentrations of the N type and P type doping impurities are indicated, as is customary, by adding the sign − or + to the letters N and P; the letters N and P without the − or + signs denote concentrations of intermediate values).

Two N type epitaxial layers 11 and 12 with different concentration of doping impurities, indicated by N− and N are formed on the substrate 10. The layer 11, together with the substrate 10, contains the collector region of the bipolar transistor. A metallic layer 28 applied to the free surface of the substrate constitutes the collector terminal, which is also one of the terminals of the integrated device.

A P− region, indicated by 13, formed between the epitaxial layers 11 and 12, and therefore "buried" between them, constitutes the base region of the bipolar transistor. A base insulation and deep contact P+ region 15 extends from the front surface of the plate, that is to say, from the surface opposed to the metallic layer 28 with the collector terminal C, as far as the edge of the base region 13, delimiting within it an insulated N region, indicated by 16. A second buried N type region 14 having a greater concentration of doping impurities than that of the insulated region 16 is formed on the P− region 13 so as to form a junction therewith, and constitutes the emitter region of the bipolar transistor.

Within the insulated region 16 there extends a P region 25, formed by a surface part 25a with low concentration (P−) and by a deep part 25b with high concentration (P+) of doping impurities, which constitutes the body region of the VDMOS transistor and which contains the channel 17 of the transistor itself.

Within the body region 25 there is formed an N+ region 26 which constitutes the source region of the VDMOS transistor. A strip 22 of electroconductive material, which overhangs the channel and is insulated from the surface of the plate by a thin layer of dielectric, constitutes the gate electrode, which is also a terminal of the device, indicated by G.

Electroconductive surface contact strips 4 and 5 are formed, respectively, on the source region 26 and on the insulation region 15 and constitute, respectively, the source terminal S of the VDMOS transistor, which is also one of the terminals of the integrated device, and the base terminal B of the bipolar transistor. The drain region of the VDMOS transistor includes the part of the insulated N region 16 included between the buried emitter region 14 and the body region 25 and is therefore in common with the emitter region of the bipolar transistor. The region 14, in this example, is not connected to external electrodes. If necessary, however, an N+ deep contact region (sinker) can easily be formed to extend from the front surface of the plate to the N+ region 14 to connect it to an external electrode or to other components integrated in the same plate.

It is intended that the VDMOS structure described above forms, on its own, the electronic switch of the "emitter switching" device, but could also be only a cell of a VDMOS transistor composed of a multiplicity of identical cells.

In order to understand the problem underlying the invention, reference is made to FIG. 2 which shows a diagram of a simple circuit including an emitter switching device of the type described above. The bipolar transistor, of the NPN type, indicated by T1, has the collector C connected to the terminal Vcc of a supply voltage source across a load ZL. The emitter E is connected to the drain D of the VDMOS transistor, indicated by T2, and the base B is connected to both a base polarization terminal Vbb, through a resistor Rb, and to the source S of the VDMOS transistor through a Zener diode DZ. The VDMOS transistor T2 has the source S connected to the second terminal of the supply source, indicated by a ground symbol, and the gate electrode G connected to a terminal of the device to which a command signal Vgs is applied. The polarization voltage Vbb is selected such that the current Ic of the collector is that necessary to feed the load, and the command signal Vgs is selected so as to keep the VDMOS transistor T2 open or closed at pre-established time intervals. The reverse conduction voltage Vz of the Zener diode DZ is selected to have a higher value than the voltage Vbe between base and emitter of the bipolar transistor T1 in conduction.

In operation, the bipolar transistor T1 starts to conduct as soon as the voltage Vgs exceeds the threshold value of the VDMOS transistor T2. During the conduction of the transistor T1, the Zener diode DZ does not conduct because the voltage between the base of T1 and ground is only slightly higher than the voltage Vbe. The higher the efficiency of the bipolar transistor T1 is, and the lower the conduction resistance Ron of the VDMOS transistor T2 is, and the greater the current carrying capacity of the device. In the switched off phase of the device, i.e. when the gate voltage Vgs drops below the threshold voltage of the transistor T2, the transistor T2 cuts off and the emitter current of T1 is canceled out. During this phase, the collector current of T1 flows through the base region of T1 and through the Zener diode DZ to the ground terminal. The lower the resistivity of the base region (13 in FIG. 1), the lower the energy dissipated in this phase.

While the device is switched off, the emitter/drain voltage reaches a value equal to the sum of the voltage BVebo (reverse break voltage of the emitter-base junction of the transistor T1 with collector open) and of the Zener voltage Vz. Therefore the VDMOS transistor T2 must be capable of withstanding this voltage between its drain-source terminals. In other words, the following inequality must be fulfilled:

$$Bvebo+Vz<BVdss$$

where BVdss is the break voltage between drain and source with gate at the source voltage.

In the planning stage, there is a tendency to make the sum of the two terms in the first part of the inequality as small as possible. The voltage Vz is determined by the values of Vbe of the transistor T1 and of Ron of T2 (typically a few volts). The value of BVebo depends on the concentrations of doping impurities in the regions 14 and 13 (FIG. 1). In practice, the concentration of impurities in the base region are increased as much as possible, because, besides reducing the voltage BVebo, it improves the performance of the device in the switched off phase, i.e. when the collector current flows to ground through the base-collector junction and through the Zener diode DZ. However, an increase in the concentration of impurities in the base has two unwanted effects, e.g. a reduction in the gain of the bipolar transistor T1 and an increase in the resistivity of the drain region, since the P type doping of the base region tends to compensate for the doping of the N drain region, thus increasing the resistivity of the drain region. This entails an increase in the resistance in conduction Ron of the VDMOS transistor T2.

SUMMARY OF THE INVENTION

An object of the present invention is to provide an integrated circuit device including a bipolar transistor and an electronic switch which are connected to one another in an emitter switching configuration and which will have optimum electrical characteristics, and in particular a high gain of the bipolar transistor and a low resistance of the electronic switch in conduction.

This and other objects, features and advantages in accordance with the present invention are provided by a semiconductor device including a bipolar transistor and an electronic switch which are connected in an emitter switching configuration. The device includes a substrate, an epitaxial layer, having a first type of conductivity, on the substrate and containing at least part of a collector region of the bipolar transistor, and a base region of the bipolar transistor, having a second type of conductivity, and buried in the epitaxial layer. The base region comprises a plurality of zones having different concentrations of doping impurities. Furthermore, the device includes a contact region, having the second type of conductivity, and extending in the epitaxial layer from a front surface of the device to the base region, and a first active region of the electronic switch comprising an insulated region having the first type of conductivity and being delimited by the contact region. Also, the device includes a second active region of the electronic switch, having the second type of conductivity, and extending from the front surface of the device into the insulated region, and a third active region of the electronic switch, having the first type of conductivity, and extending from the front surface of the device into the second active region.

The epitaxial layer may have a relatively lower concentration of doping impurities than the third active region, and the base region may have a relatively lower concentration of doping impurities than the contact region. Further, the device may include a first device terminal contacting the substrate, a second device terminal contacting the base region via the contact region, a third device terminal contacting the third active region, and a fourth device terminal coupled to the second active region. At least some of the plurality of zones, corresponding to portions of the first active region in which there is a more intense flow of charge carriers during device operation, may have a relatively lower concentration of doping impurities than other zones of the plurality of zones. The substrate may have the first type of conductivity or the second type of conductivity.

Also, the insulated region may comprise at least one area having a relatively higher concentration of doping impurities than a remainder of the insulated region, the area having a more intense flow of charge carriers during device operation. The electronic switch may comprise a VDMOS type transistor with a drain region in the first active region, a body region in the second active region, and a source region in the third active region. Alternatively, the electronic switch may comprise a bipolar transistor with a collector region in the first active region, a base region in the second active region, and an emitter region in the third active region. The bipolar transistor may form part of an IGBT type device.

BRIEF DESCRIPTION OF THE DRAWINGS

The invention will become clear from the following detailed description of one of its embodiments provided by way of non-limiting example with reference to the appended drawings, in which.

DETAILED DESCRIPTION OF THE PREFERRED EMBODIMENTS

Figure 1:
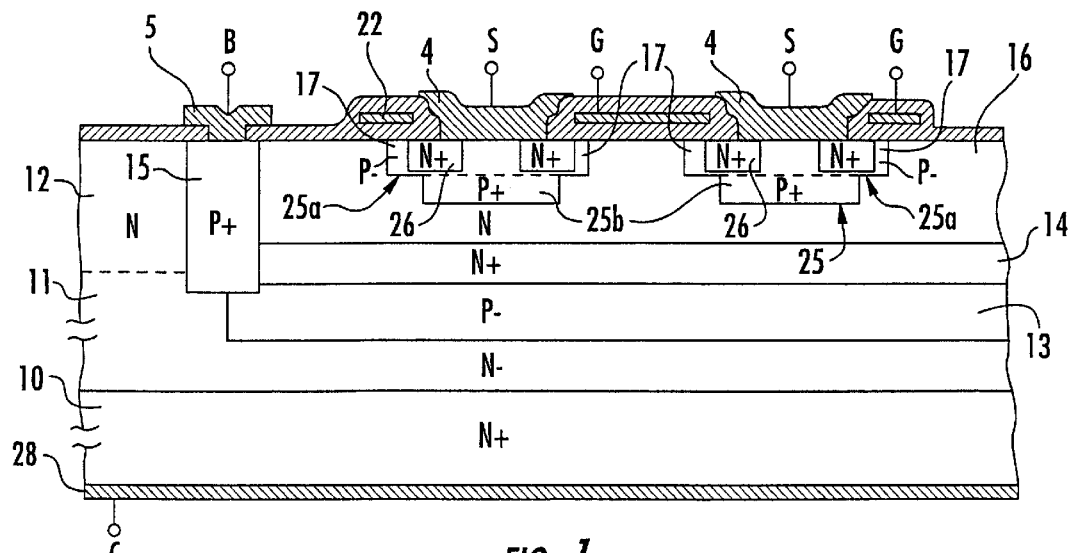
FIG. 1 is a cross-sectional view of the structure of a prior art emitter switching device.
Figure 2:
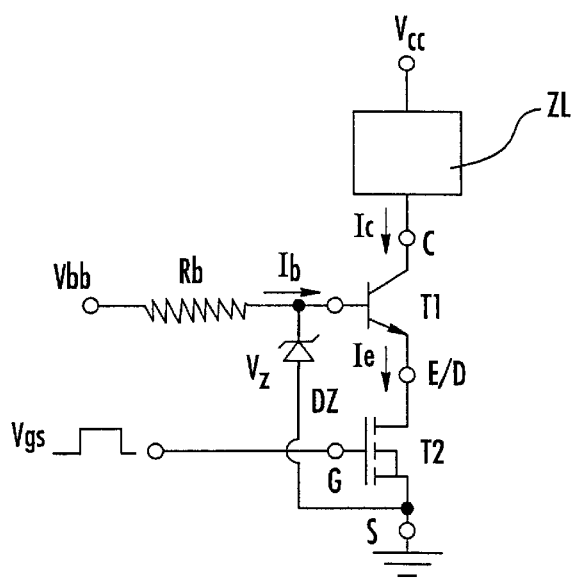
FIG. 2 is a circuit diagram of the equivalent electrical circuit of the device in FIG. 1.
Figure 3:
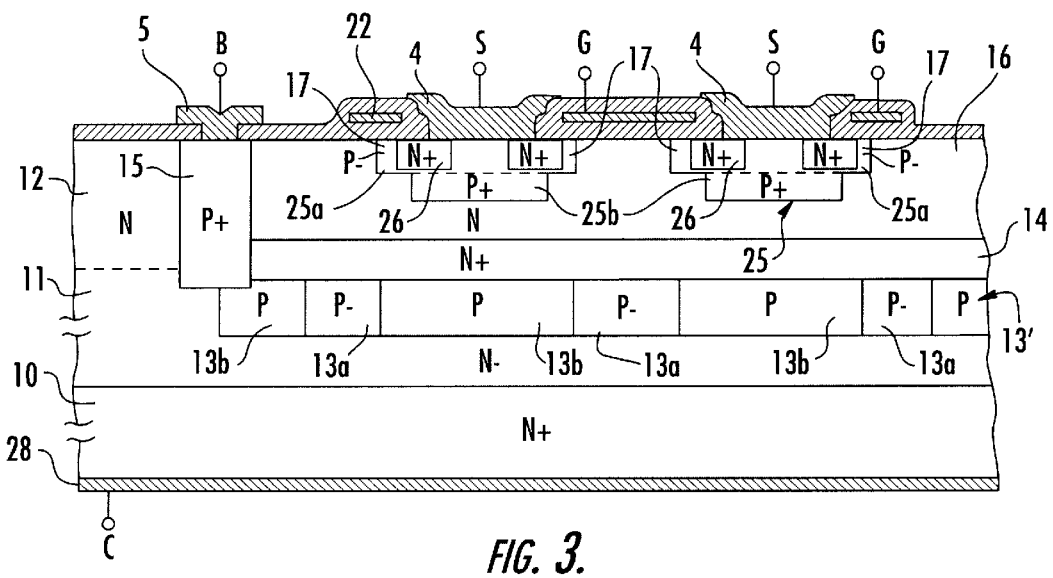
FIG. 3 is a cross-sectional view of the structure of an emitter switching device according to the invention.

The device according to the invention shown in FIG. 3 is an emitter switching device, and therefore parts identical to those in FIG. 1 are indicated by the same reference symbol. The emitter switching device of FIG. 3 differs from the known device in FIG. 1 in that the base region of the bipolar transistor T1, indicated by 13' in FIG. 3, does not have a uniform mean concentration of doping impurities throughout its horizontal extent, but includes various zones with different mean concentrations.

Figure 4:
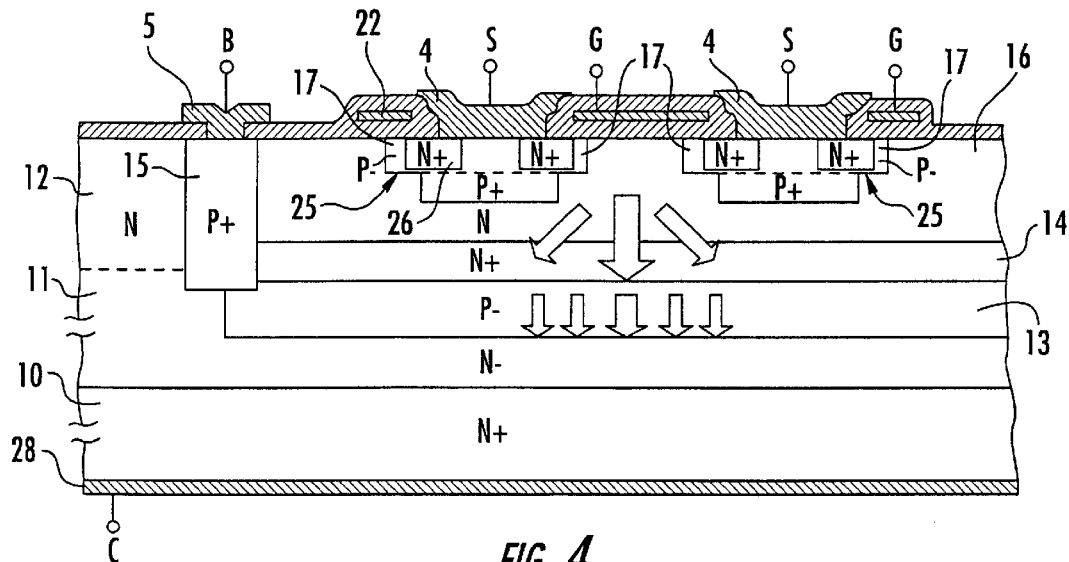
FIGS. 4 and 5 are cross-sectional views showing the flow of current in the devices according to FIGS. 1 and 3 respectively.

In an exemplary embodiment of the present invention, the regions which constitute the structure may have the following values for resistivity or concentration of doping impurities:

region 10: 1–3 mohm/G
region 11: 5–7×10$^{13}$ cm$^{-3}$
region 13': 2–4 kohm/G
region 14: 18–22 ohm/G
region 16: 2–5×10$^{13}$ cm$^{-3}$
region 25a: 25–35 ohm/G
region 25b: 8–100 ohm/G
region 26: 10$^{19}$–10$^{20}$ cm$^{-3}$ The zones indicated by 13a and characterized by the symbol P− are zones with a lower concentration of impurities and the zones indicated by 13b and characterized by the symbol P are zones with a higher concentration of impurities, for example two or three times greater than that of the zones 13a. The zones of lower concentration 13a are arranged below the portions of the drain region in which the flow of charge carriers during the operation of the device is more intense, while the zones of higher concentration 13b are situated at the portions of the drain region in which the flow is less intense. The operation and the advantages of the device according to the invention will now be explained with reference to FIGS. 4 and 5. As shown in FIG. 4, in the prior art structure, the flow of charges issuing from the source regions of the VDMOS transistor expands by passing from the more resistive zones of the drain/emitter region, i.e. from the zones of the insulated region 16 which are adjacent to the channel 17 of the VDMOS transistor, to those which are less resistive, i.e. to those of the buried N+ region 14. The zones of the drain/emitter region which are situated below the body regions 25 contribute to a lesser extent to the current carrying capacity of the device.

The portion of silicon underlying the VDMOS transistor may be regarded as including a number of contiguous elementary bipolar transistors. The contribution of each of the elementary transistors to the overall collector current of the bipolar transistor depends on the charges available in the emitter, i.e. on the flow of the charges issuing from the source region of the VDMOS transistor. Since the flow is not homogeneous, the contributions of the elementary transistors are different.

Figure 5:
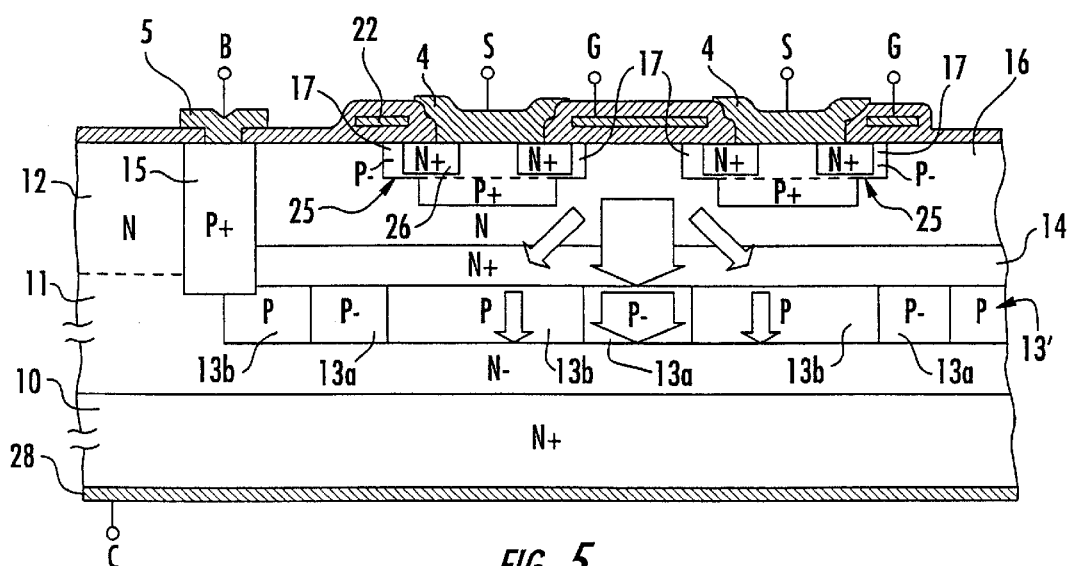

With the structure according to the invention, the gain of the elementary transistors which receive more charges is higher than that of the transistors which receive fewer charges. The gain of-a bipolar transistor is directly proportional to the ratio between the concentration of the doping impurities in the emitter and the concentration of the doping impurities in the base. With equal doping of the emitters, therefore, it is greater with less doped bases. In the embodiment of FIG. 3, the elementary transistors having a higher gain are those which have the base in the zones 13a having a lower concentration. The elementary transistors having a lower gain are those which have the base in the zones 13b having a higher concentration, and contribute to a lesser extent to the overall current of the device. As shown in FIG. 5, the current flow in the device occurs essentially in the base zones 13a having a low concentration, since the mean resistivity of the base region underlying the VDMOS transistor (zone 13a+zone 13b) is less than that of the base region according to the prior art. The consequence of this is an improvement in the performance of the device in the switched off phase, since a high concentration of impurities in the base region reduces the emitter-base break voltage BVebo, as already emphasized above.

The low value of the concentration of impurities in the regions 13a has a positive effect also on the resistance Ron of the VDMOS transistor in conduction, since in the more resistive drain region, i.e. in that region adjacent to the channel, the compensation of the N type doping by the P type doping coming from the base is less effective.

Figure 6:
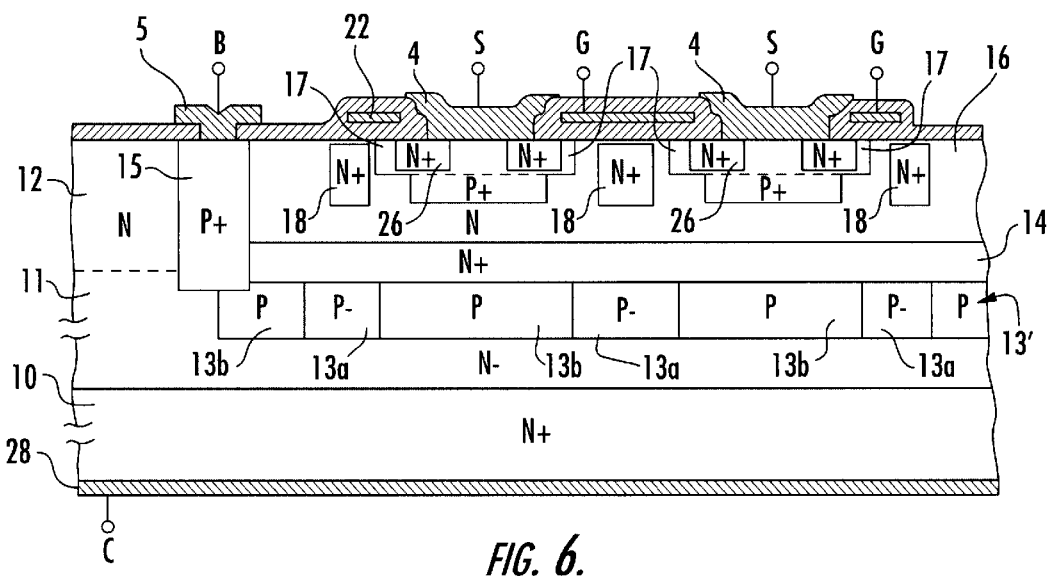
FIG. 6 is a cross-sectional view of a variant of the structure of an emitter switching device according to the invention.

A further reduction in the resistance Ron is obtained, according to the embodiment of the invention shown in FIG. 6, by forming an N type region with high concentration in the drain region 18 which extends from a short distance from the surface of the plate to the buried N+ layer 14. The region may have a resistivity of 10–18 ohm/G and is produced by customary operations of masking and implantation, as well as a phase of heating to a high temperature for the diffusion of the implanted doping. This latter operation may be a heating phase already provided in the standard process.

The base region 13 with zones of different concentration is preferably obtained by the technique of so-called variable transparency, known also by the abbreviation VLD (Variation Lateral Doping), with a single ion implantation operation. The operation is performed immediately after the formation of the epitaxial layer 11 by carrying out implantation through a mask provided with suitably spaced openings, as described for example in U.S. Pat. No. 3,436,282. In this way, supplementary treatment phases are not added to the standard process. Some other process which make it possible to obtain zones with different concentrations may, of course, also be used.

In sum, with the device according to the invention, the distribution of the current in the collector in proximity to the base region is focussed and condensed at the zones of lesser concentration of the base region. In this way, the current carrying capacity of the more efficient elementary transistors is increased and that of the less efficient elementary transistors is attenuated, to the advantage in any case of a smaller base mean resistance and of an overall current carrying capacity of the device greater than that of the conventional device.

In the two embodiments illustrated and described, the device according to the invention has a vertical VDMOS transistor with body region having differentiated concentration, i.e. with a deep body zone P+ and a surface body zone P. It should be apparent that the invention can be put into practice with the same advantages also with a vertical VDMOS transistor having a single body region. The structure according to the invention can be produced also with an electronic switch including a bipolar type, low voltage, transistor in place of the VDMOS transistor. In this case the considerations mentioned above are still valid by substituting the voltage BVdss and the Ron of the VDMOS transistor, respectively, with the voltage BVces and the collector resistance of the low voltage bipolar transistor. Moreover, the structure according to the invention may be used also to produce an IGBT (Insulated Gate Bipolar Transistor) device of the "smart" type. In this case the substrate 10 will preferably have a type of conductivity opposite to that of the overhanging epitaxial layer or layers 11, 12.

What is claimed is:

1. A semiconductor device including a bipolar transistor and an electronic switch which are connected in an emitter switching configuration, the device comprising:

a substrate;

an epitaxial layer, having a first type of conductivity, on the substrate and containing at least part of a collector region of the bipolar transistor;

a base region of the bipolar transistor, having a second type of conductivity, and buried in the epitaxial layer, the base region comprising a plurality of zones having different concentrations of doping impurities arranged in a direction parallel to a front surface of the device;

a contact region, having the second type of conductivity, which extends in the epitaxial layer from the front surface of the device to the base region;

a first active region of the electronic switch comprising an insulated region having the first type of conductivity and being delimited by the contact region, the first active region being above and in direct contact with the plurality of zones of the base region;

a second active region of the electronic switch, having the second type of conductivity, and extending from the front surface of the device into the insulated region; and a third active region of the electronic switch, having the first type of conductivity, and extending from the front surface of the device into the second active region.

2. A device according to claim 1, wherein the epitaxial layer has a relatively lower concentration of doping impurities than the third active region.

3. A device according to claim 1, wherein the base region has a relatively lower concentration of doping impurities than the contact region.

4. A device according to claim 1, further comprising:
   a first device terminal contacting the substrate;
   a second device terminal contacting the base region via the contact region;
   a third device terminal contacting the third active region; and
   a fourth device terminal adjacent to the second active region.

5. A device according to claim 1, wherein at least some of the plurality of zones, corresponding to portions of the first active region in which there is a more intense flow of charge carriers during device operation, have a relatively lower concentration of doping impurities than other zones of the plurality of zones.

6. A device according to claim 1, wherein the insulated region comprises at least one area having a relatively higher concentration of doping impurities than a remainder of the insulated region, the area having a more intense flow of charge carriers during device operation.

7. A device according to claim 1, wherein the electronic switch comprises a VDMOS type transistor with a drain region in the first active region, a body region in the second active region, and a source region in the third active region.

8. A device according to claim 1, wherein the electronic switch comprises a bipolar transistor with a collector region in the first active region, a base region in the second active region, and an emitter region in the third active region.

9. A device according to claim 1, wherein the bipolar transistor forms part of an IGBT type device.

10. A device according to claim 1, wherein the substrate has the first type of conductivity.

11. A device according to claim 1, wherein the substrate has the second type of conductivity.

12. A semiconductor device including a bipolar transistor and an electronic switch which are connected in an emitter switching configuration, the device comprising:
    a substrate having a relatively high concentration of doping impurities;
    an epitaxial layer, having a first type of conductivity with a relatively low concentration of doping impurities, on the substrate and containing at least part of a collector region of the bipolar transistor;
    a first device terminal contacting the substrate;
    a base region of the bipolar transistor, having a second type of conductivity with a relatively low concentration of doping impurities, and buried in the epitaxial layer, the base region comprising a plurality of zones having different concentrations of doping impurities arranged in a direction parallel to a front surface of the device;
    a contact region, having the second type of conductivity with a relatively high concentration of doping impurities, which extends in the epitaxial layer from the front surface of the device to the base region;
    a first active region of the electronic switch comprising an insulated region having the first type of conductivity and being delimited by the contact region, the first active region being above and in direct contact with the plurality of zones of the base region;
    a second active region of the electronic switch, having the second type of conductivity, and extending from the front surface of the device into the insulated region;
    a third active region of the electronic switch, having the first type of conductivity with a relatively high concentration of doping impurities, and extending from the front surface of the device into the second active region;
    a second device terminal contacting the base region via the contact region;
    a third device terminal contacting the third active region of the electronic switch; and
    a fourth device terminal adjacent to the second active region of the electronic switch.

13. A device according to claim 12, wherein at least some zones, of the plurality of zones having different concentrations and corresponding to portions of the first active region in which there is a more intense flow of charge carriers during device operation, have a relatively lower concentration of doping impurities.

14. A device according to claim 12, wherein the insulated region comprises at least one area having a relatively higher concentration of doping impurities than a remainder of the insulated region, the area having a more intense flow of charge carriers during device operation.

15. A device according to claim 12, wherein the electronic switch comprises a VDMOS type transistor with a drain region in the first active region, a body region in the second active region, and a source region in the third active region.

16. A device according to claim 12, wherein the electronic switch comprises a bipolar transistor with a collector region in the first active region, a base region in the second active region, and an emitter region in the third active region.

17. A device according to claim 12, wherein the bipolar transistor forms part of an IGBT type device.

18. A device according to claim 12, wherein the substrate has the first type of conductivity.

19. A device according to claim 12, wherein the substrate has the second type of conductivity.

* * * * *

UNITED STATES PATENT AND TRADEMARK OFFICE
CERTIFICATE OF CORRECTION

PATENT NO. : 6,441,445 B1
DATED : August 27, 2002
INVENTOR(S) : Salvatore Leonardi, Davide Patti and Delfo Sanfilippo It is certified that error appears in the above-identified patent and that said Letters Patent is hereby corrected as shown below:

<u>Title page,</u>
Insert -- [30] Foreign Application Priority Data
      Oct. 6, 1998   (IT) ................MI98A002146 --

<u>Column 1,</u>
Line 42, delete "N- and N" insert -- - and N --

Signed and Sealed this

Eighteenth Day of March, 2003

JAMES E. ROGAN
*Director of the United States Patent and Trademark Office*